(12) United States Patent
Dai

(10) Patent No.: US 9,558,702 B2
(45) Date of Patent: Jan. 31, 2017

(54) SELF-COMPENSATING GATE DRIVING CIRCUIT

(71) Applicant: Shenzhen China Star Optoelectronics Technology Co., Ltd., Shenzhen, Guangdong (CN)

(72) Inventor: Chao Dai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 220 days.

(21) Appl. No.: 14/398,975

(22) PCT Filed: Aug. 14, 2014

(86) PCT No.: PCT/CN2014/084344
§ 371 (c)(1),
(2) Date: Nov. 4, 2014

(87) PCT Pub. No.: WO2016/008193
PCT Pub. Date: Jan. 21, 2016

(65) Prior Publication Data
US 2016/0284296 A1  Sep. 29, 2016

(30) Foreign Application Priority Data
Jul. 17, 2014 (CN) .......................... 2014 1 0342900

(51) Int. Cl.
*G09G 3/36* (2006.01)

(52) U.S. Cl.
CPC .............. *G09G 3/3648* (2013.01); *G09G 3/36* (2013.01); *G09G 2300/04* (2013.01); *G09G 2310/0278* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| 8,023,613 | B2 * | 9/2011 | Tsai | ...................... | G09G 3/3677 377/64 |
| 8,229,058 | B2 * | 7/2012 | Tsai | ...................... | G09G 3/3677 377/64 |
| 8,396,183 | B2 * | 3/2013 | Yang | ........................ | G09G 3/20 377/64 |
| 8,537,094 | B2 * | 9/2013 | Yang | ..................... | G09G 3/3677 345/100 |

(Continued)

*Primary Examiner* — Dismery Mercedes
(74) *Attorney, Agent, or Firm* — Andrew C. Cheng

(57) ABSTRACT

A self-compensating gate driving circuit includes cascade-connected GOA units of which a Nth GOA unit includes a pull-up controlling part, a pull-up part, a transmission part, a first pull-down part, a bootstrap capacitor part and a pull-down holding part. The pull-up part, the first pull-down part, the bootstrap capacitor part and the pull-down holding circuit are respectively coupled to a Nth gate signal point Q(N) and a Nth horizontal scanning line G(n). The pull-up controlling part and the transmission part are each coupled to the Nth gate signal point Q(N). The pull-down holding part is inputted with a first DC low voltage VSS1 and a second DC low voltage VSS2. The pull-down holding part includes a first pull-down holding part and a second pull-down holding part to alternately work.

12 Claims, 8 Drawing Sheets

(56) References Cited

U.S. PATENT DOCUMENTS

| | | | | |
|---|---|---|---|---|
| 8,971,479 B2* | 3/2015 | Chang | ............... | G09G 3/3655 |
| | | | | 377/64 |
| 9,087,596 B2* | 7/2015 | Su | ............... | G09G 3/3659 |
| 9,240,156 B2* | 1/2016 | Dai | ............... | G02F 1/13306 |
| 9,324,288 B1* | 4/2016 | Dai | ............... | G09G 3/3648 |
| 9,373,413 B2* | 6/2016 | Wang | ............... | G11C 19/28 |
| 9,401,120 B2* | 7/2016 | Xiao | ............... | G09G 3/3696 |
| 2010/0171728 A1* | 7/2010 | Han | ............... | G09G 3/3677 |
| | | | | 345/211 |
| 2011/0298771 A1* | 12/2011 | Yoo | ............... | G09G 3/20 |
| | | | | 345/211 |
| 2012/0153996 A1* | 6/2012 | Su | ............... | G09G 3/3659 |
| | | | | 327/109 |
| 2015/0325190 A1* | 11/2015 | Cao | ............... | G11C 19/28 |
| | | | | 345/100 |

* cited by examiner

SELF-COMPENSATING GATE DRIVING CIRCUIT

FIELD OF THE INVENTION

The present invention relates to a display skill field, and more particularly to a self-compensating gate driving circuit.

BACKGROUND OF THE INVENTION

GOA (Gate Driver on Array) skill is to integrate the TFT (Thin Film Transistor) of a gate driving circuit on the array substrate and to eliminate the integrated circuit part of the gate driving circuit located outside the array substrate. Accordingly, two aspects of material cost and process is considered to reduce the manufacture cost of the productions. GOA skill is a common gate driving circuit skill used in a present TFT-LCD (Thin Film Transistor-Liquid Crystal Display). The manufacture process is simple and provides great application possibilities. The functions of the GOA circuit mainly comprises: the present gate line outputs a high level signal with charging the capacitor of the shift register unit by using the high level signal outputted from the previous gate line, and then reset is achieved by using the high level signal outputted from the next gate line.

Please refer to FIG. 1, which is a single level structural diagram of a GOA circuit commonly employed in panel display according to prior art. It comprises: a plurality of GOA units which are cascade connected, and a nth gate driver on array unit controls charge to a nth horizontal scanning line G(n) in a display area, and the nth gate driver on array unit comprises pull-up controlling part 1', a pull-up part 2', a transmission part 3', a first pull-down part 4' (Key pull-down part), a bootstrap capacitor part 5' and a pull-down holding part 6' (Pull-down holding part). The pull-up part 2', the first pull-down part 4', the bootstrap capacitor part 5' and the pull-down holding part 6' are respectively coupled to a Nth gate signal point Q(n) and the Nth horizontal scanning line G(n), and the pull-up controlling part 1' and the transmission part 3' are respectively coupled to the Nth gate signal point Q(n), and the pull-down holding part 6' is inputted with a DC low voltage VSS.

The pull-up controlling part 1' comprises a first thin film transistor T1', and a gate of the first thin film transistor T1' is inputted with a transmission signal ST(N−1) from the N−1th GOA unit, and a drain is electrically coupled to the N−1th horizontal scanning line G(N−1), and a source is electrically coupled to the Nth gate signal point Q(N); the pull-up part 2' comprises a second thin film transistor T2', and a gate of the second thin film transistor T2' is electrically coupled to the Nth gate signal point Q(N), and a drain is inputted with a first high frequency clock CK or a second high frequency clock XCK, and a source is electrically coupled to the Nth horizontal scan line G(N); the transmission part 3' comprises a third thin film transistor T3', and a gate is electrically coupled to the Nth gate signal point Q(N), and a drain is inputted with a first high frequency clock CK or a second high frequency clock XCK, and a source outputs a Nth transmission signal ST(N); the first pull-down part 4' comprises a fourth thin film transistor T4', and a gate of the fourth thin film transistor T4' is electrically coupled to the N+1th horizontal scan line G(N+1), and a drain is electrically coupled to the Nth horizontal scan line G(N), and a source is inputted with the DC low voltage VSS; a fifth thin film transistor T5', and a gate of the fifth thin film transistor T5' is electrically coupled to a N+1th horizontal scan line G(N+1), a drain is electrically coupled to the Nth gate signal point Q(N), and a source is inputted with the DC low voltage VSS; the bootstrap capacitor part 5' comprises a bootstrap capacitor Cb'; the pull-down holding part 6' comprises a sixth thin film transistor T6', and a gate of the sixth thin film transistor T6' is electrically coupled to a first circuit point P(N)', and a drain is electrically coupled to the Nth horizontal scan line G(N), and a source is inputted with the DC low voltage VSS; a seventh thin film transistor T7', and a gate of the seventh thin film transistor T7' is electrically coupled to a first circuit point P(N)', and a drain is electrically coupled to Nth gate signal point Q(N), and a source is inputted with the DC low voltage VSS; an eighth thin film transistor T8', and a gate of the eighth thin film transistor T8' is electrically coupled to a second circuit point K(N)', and a drain is electrically coupled to the Nth horizontal scan line G(N), and a source is inputted with the DC low voltage VSS; a ninth thin film transistor T9', and a gate of the ninth thin film transistor T9' is electrically coupled to the second circuit point K(N)', and a drain is electrically coupled to the Nth gate signal point Q(N), and a source is inputted with the DC low voltage VSS; a tenth thin film transistor T10', and a gate of the tenth thin film transistor T10' is inputted with a first low frequency clock LC1, and a drain is inputted with a first low frequency clock LC1, and a source is electrically coupled to the first circuit point P(N)'; an eleventh thin film transistor T11', and a gate of the eleventh thin film transistor T11' is inputted with a second low frequency clock LC2, and a drain is inputted with the first low frequency clock LC1, and a source is electrically coupled to the first circuit point P(N)'; a twelfth thin film transistor T12', and a gate of the twelfth thin film transistor T12' is inputted with the second low frequency clock LC2, and a drain is inputted with the second low frequency clock LC2, and a source is electrically coupled to the second circuit point K(N)'; a thirteenth thin film transistor T13', and a gate of the thirteenth thin film transistor T13' is inputted with the first low frequency clock LC1, and a drain is inputted with the second low frequency clock LC2, and a source is electrically coupled to the second circuit point K(N)'; a fourteenth thin film transistor T14', and a gate of the fourteenth thin film transistor T14' is electrically coupled to the Nth gate signal point Q(N), and a drain is electrically coupled to the first circuit point P(N)', a source is inputted with the DC low voltage VSS; a fifteenth thin film transistor T15', and a gate of the fourteenth thin film transistor T15' is electrically coupled to the Nth gate signal point Q(N), and a drain is electrically coupled to the second circuit point K(N)', and a source is inputted with the DC low voltage VSS; wherein the sixth thin film transistor T6' and the eighth thin film transistor T8' are in charge of keeping the low voltage level at the Nth horizontal scan line G(N) in the non functioning period. The seventh thin film transistor T7' and the ninth thin film transistor T9' are in charge of keeping the low voltage level at the Nth gate signal point Q(N) in the non functioning period.

From the viewpoint of overall circuit structure, the pull-down holding part 6' is in a state of having a longer working period. In other word, the first circuit point P(N)' and the second circuit point K(N)' are in a positive high voltage state for a long period of time. Under the most serious voltage stresses are the thin film transistors T6', T7', T8', T9'. Along with the increase of the working period of the gate driving circuit, the threshold voltages Vth of the thin film transistors T6', T7', T8', T9' are gradually increased and the activation currents are gradually decreased. Thus, the Nth horizontal scan line G(N) and the Nth gate signal point Q(N) cannot be well kept in a steady low voltage level state. This is a significant factor of influencing the reliability of the gate driving circuit.

For an amorphous silicon TFT gate driving circuit, the pull-down holding part is essential. In general, the design can be one pull-down holding part, or two alternately functioning pull-down holding parts. The main objective of the design of the two alternately functioning pull-down holding parts is to the voltage stress applying to the thin film transistors T6', T7', T8', T9' controlled by the first circuit point P(N)' and the second circuit point K(N)' in the pull-down holding part. However, it is found with actual measurement that the four thin film transistors T6', T7', T8', T9' still suffer the most serious voltage stress in the entire gate driving circuit even the design of two alternately functioning pull-down holding parts is applied. Thus, the threshold voltages (Vth) of these thin film transistors drift most.

Please refer to FIG. 2a, which is a relationship diagram of the overall current logarithm and the voltage curve of the thin film transistor before and after the threshold voltage drift. The full line is the relationship curve of the current logarithm and the voltage that the threshold voltage drift does not occur. The dotted line is the relationship curve of the current logarithm and the voltage that the threshold voltage drift occurs. As shown in FIG. 2a, the current logarithm Log(Ids) that no threshold voltage drift occurs is larger than the current logarithm that the threshold voltage drift occurs under the circumstance of the same gate-source voltage Vgs. Please refer to FIG. 2b, which is a relationship diagram of the overall current and the voltage curve of the thin film transistor before and after the threshold voltage drift. As shown in FIG. 2b, the gate voltage Vg1 that no threshold voltage drift occurs is larger than the gate voltage Vg2 that the threshold voltage drift occurs under the circumstance of the same gate-source current Ids. Thus, after the threshold voltage drift occurs, a larger gate voltage is necessary once reaching the same level source current Ids is requested.

As shown in FIG. 2a and FIG. 2b, threshold voltage Vth drifts toward the positive and the activation current Ion of the thin film transistor is gradually decreased. The activation current Ion of the thin film transistor will gradually decrease along with the increase of the threshold voltage Vth. Thus, to the circuit, the voltage level of the Nth horizontal scan line G(N) and the Nth gate signal point Q(N) cannot be well kept in a steady state. Consequently, an abnormal image display of the liquid crystal display will happen.

As aforementioned, the most possible failed elements are the thin film transistors T6', T7', T8', T9' of the pull-down holding part. Therefore, this issue has to be solved for promoting the reliabilities of the gate driving circuit and the liquid crystal display panel. In a common and normal design, the dimensions of these four thin film transistors T6', T7', T8', T9' are increased. However, the deactivation leak current of the working thin film transistors will increase when the dimensions of the thin film transistors are increased and the issue cannot be substantially solved.

SUMMARY OF THE INVENTION

An objective of the present invention is to provide a self-compensating gate driving circuit to promote the reliability of the long term operation for the gate driving circuit by a pull-down holding part with self-compensating function. The influence of the threshold voltage drift to the operation of the gate driving circuit is diminished.

For realizing the aforesaid objective, the present invention provides a self-compensating gate driving circuit, comprising: a plurality of GOA units which are cascade connected, and a Nth GOA unit controls charge to a Nth horizontal scanning line G(n) in a display area, and the Nth GOA unit comprises a pull-up controlling part, a pull-up part, a transmission part, a first pull-down part, a bootstrap capacitor part and a pull-down holding part; the pull-up part, the first pull-down part, the bootstrap capacitor part and the pull-down holding circuit are respectively coupled to a Nth gate signal point Q(N) and the Nth horizontal scanning line G(n), and the pull-up controlling part and the transmission part are respectively coupled to the Nth gate signal point Q(N), and the pull-down holding part is inputted with a first DC low voltage VSS1 and a second DC low voltage VSS2;

the pull-down holding part comprises a first pull-down holding part and a second pull-down holding part to alternately work;

the first pull-down holding part comprises: a first thin film transistor T1, and a gate of the first thin film transistor T1 is electrically coupled to the first circuit point P(N), and a drain is electrically coupled to the Nth horizontal scanning line G(N), and a source is inputted with the first DC low voltage VSS1; a second thin film transistor T2, and a gate of the second thin film transistor T2 is electrically coupled to the first circuit point P(N), and a drain is electrically coupled to the Nth gate signal point Q(N), and a source is inputted with the first DC low voltage VSS1; a third thin film transistor T3, and a gate of the third thin film transistor T3 is electrically coupled to a first low frequency clock LC1 or a first high frequency clock CK, and a drain is electrically coupled to the first low frequency clock LC1 or a first high frequency clock CK, and a source is electrically coupled to a second circuit point S(N); a fourth thin film transistor T4, and a gate of the fourth thin film transistor T4 is electrically coupled to the Nth gate signal point Q(N), and a drain is electrically coupled to the second circuit point S(N), and a source is inputted with the first DC low voltage VSS1; a fifth thin film transistor T5, and a gate of the fifth thin film transistor T5 is electrically coupled to a N−1th transmission signal ST(N−1), a drain is electrically coupled to the first circuit point P(N), and a source is inputted with the first DC low voltage VSS1; a sixth thin film transistor T6, and a gate of the sixth thin film transistor T6 is electrically coupled to a N+1th horizontal scan line G(N+1), and a drain is electrically coupled to the first circuit point P(N), and a source is electrically coupled to the Nth gate signal point Q(N); a seventh thin film transistor T7, and a gate of the seventh thin film transistor T7 is electrically coupled to a second low frequency clock LC2 or a second high frequency clock XCK, and a drain is a first low frequency clock LC1 or a first high frequency clock CK, and a source is electrically coupled to the second circuit point S(N); an eighth thin film transistor T8, and a gate of the eighth thin film transistor T8 is electrically coupled to a Nth transmission signal ST(N), and a drain is electrically coupled to the first circuit point P(N), and a source is inputted with the first DC low voltage VSS1; a ninth thin film transistor T9, and a gate of the ninth thin film transistor T9 is electrically coupled to the first circuit point P(N), and a drain is electrically coupled to the Nth transmission signal ST(N), and a source is inputted with a second DC low voltage VSS2; a first capacitor Cst1, and an upper electrode plate of the first capacitor Cst1 is electrically coupled to the second circuit point S(N) and a lower electrode plate of the first capacitor Cst1 is electrically coupled to the first circuit point P(N);

the second pull-down holding part comprises: a tenth thin film transistor T9, and a gate of the tenth thin film transistor T10 is electrically coupled to the third circuit point K(N), and a drain is electrically coupled to the Nth horizontal scanning line G(N), and a source is inputted with the first DC low voltage VSS1; an eleventh thin film transistor T11, and a gate of the eleventh thin film transistor T11 is electrically coupled to the third circuit point K(N), and a drain is electrically coupled to the Nth gate signal point Q(N), and a source is inputted with the first DC low voltage VSS1; a twelfth thin film transistor T12, and a gate of the twelfth thin film transistor T12 is electrically coupled to a second low frequency clock LC2 or a second high frequency clock XCK, and a drain is electrically coupled to a second low frequency clock LC2 or a second high frequency clock XCK, and a source is electrically coupled to a fourth circuit point T(N); a thirteenth thin film transistor T13, and a gate of the thirteenth thin film transistor T13 is electrically coupled to the Nth gate signal point Q(N), and a drain is electrically coupled to the fourth circuit point T(N), and a source is inputted with the first DC low voltage VSS1; a fourteenth thin film transistor T14, and a gate of the fourteenth thin film transistor T14 is electrically coupled to a N−1th gate signal point Q(N−1), a drain is electrically coupled to the third circuit point K(N), and a source is inputted with the first DC low voltage VSS1; a fifteenth thin film transistor T15, and a gate of the fifteenth thin film transistor T15 is electrically coupled to a N+1th horizontal scan line G(N+1), and a drain is electrically coupled to the third circuit point K(N), and a source is electrically coupled to the Nth gate signal point Q(N); a sixteenth thin film transistor T16, and a gate of the sixteenth thin film transistor T16 is electrically coupled to a first low frequency clock LC1 or a first high frequency clock CK, and a drain is a second low frequency clock LC2 or a second high frequency clock XCK, and a source is electrically coupled to the fourth circuit point T(N); a seventeenth thin film transistor T17, and a gate of the seventeenth thin film transistor T17 is electrically coupled to the Nth transmission signal ST(N), and a drain is electrically coupled to the third circuit point K(N), and a source is inputted with the first DC low voltage VSS1; an eighteenth thin film transistor T18, and a gate of the eighteenth thin film transistor T18 is electrically coupled to the third circuit point K(N), and a drain is electrically coupled to the Nth transmission signal ST(N), and a source is inputted with the second DC low voltage VSS2; a second capacitor Cst2, and an upper electrode plate of the second capacitor Cst2 is electrically coupled to the fourth circuit point T(N) and a lower electrode plate of the second capacitor Cst2 is electrically coupled to the third circuit point K(N).

The pull-up controlling part comprises: a nineteenth thin film transistor T19, and a gate of the nineteenth thin film transistor T19 is inputted with a transmission signal ST(N−1) from a N−1th GOA unit, and a drain is electrically coupled to a N−1th horizontal scan line G(N−1), and a source is electrically coupled to the Nth gate signal point Q(N); the pull-up part comprises a twentieth thin film transistor T20, and a gate of the twentieth thin film transistor T20 is electrically coupled to the Nth gate signal point Q(N), and a drain is inputted with a first high frequency clock CK or a second high frequency clock XCK, and a source is electrically coupled to the Nth horizontal scan line G(N); the transmission part comprises a twenty-first thin film transistor T21, and a gate of the twenty-first thin film transistor T21 is electrically coupled to the Nth gate signal point Q(N), and a drain is inputted with the first high frequency clock CK or the second high frequency clock XCK, and a source outputs a Nth transmission signal ST(N); the first pull-down part comprises a twenty-second thin film transistor T22, and a gate of the twenty-second thin film transistor T22 is electrically coupled to a N+2th horizontal scan line G(N+2), and a drain is electrically coupled to the Nth horizontal scan line G(N), and a source is inputted with the first DC low voltage VSS1; a twenty-third thin film transistor T23, and a gate of the twenty-third thin film transistor T23 is electrically coupled to the N+2th horizontal scan line G(N+2), and a drain is electrically coupled to the Nth gate signal point Q(N), and a source is inputted with the first DC low voltage VSS1; the bootstrap capacitor part comprises a bootstrap capacitor Cb.

In the first level connection, the gate of the fifth thin film transistor T5 is electrically coupled to a circuit activation signal STV; the gate of the fourteenth thin film transistor T14 is electrically coupled to the circuit activation signal; the gate and the drain of the nineteenth thin film transistor T19 are both electrically coupled to the circuit activation signal STV.

In the last level connection, the gate of the sixth thin film transistor T6 is electrically coupled to a circuit activation signal STV; the gate of the fifteenth thin film transistor T15 is electrically coupled to the circuit activation signal; the gate of the twenty-second thin film transistor T22 is electrically coupled to the 2th horizontal scan line G(2); the gate of the twenty-third thin film transistor T23 is electrically coupled to the 2th horizontal scan line G(2).

The pull-down holding part further comprises a third capacitor Cst3, and an upper electrode plate of the third capacitor Cst3 is electrically coupled to the first circuit point P(N), and a lower electrode plate of the third capacitor Cst3 is electrically coupled to the first DC low voltage VSS1; circuit structures of the first pull-down holding part and the second pull-down holding part are the same.

The first pull-down holding part further comprises a twenty-fourth thin film transistor T24, and a gate of the twenty-fourth thin film transistor T24 is electrically coupled to the N+1th horizontal scan line G(N+1), and a drain is electrically coupled to the second circuit point S(N), and a source is inputted with the first DC low voltage VSS1; circuit structures of the first pull-down holding part and the second pull-down holding part are the same.

The pull-down holding part further comprises a third capacitor Cst3, and an upper electrode plate of the third capacitor Cst3 is electrically coupled to the first circuit point P(N), and a lower electrode plate of the third capacitor Cst3 is electrically coupled to the first DC low voltage VSS1; a twenty-fourth thin film transistor T24, and a gate of the twenty-fourth thin film transistor T24 is electrically coupled to the N+1th horizontal scan line, and a drain is electrically coupled to the second circuit point S(N), and a source is inputted with the first DC low voltage VSS1; circuit structures of the first pull-down holding part and the second pull-down holding part are the same.

The first high frequency clock CK and the second high frequency clock XCK are two high frequency clocks that phases are completely opposite; the first low frequency clock LC1 and the second low frequency clock LC2 are two low frequency clocks that phases are completely opposite.

In the first pull-down part, the gate of the twenty-second thin film transistor T22 and the gate of the twenty-third thin film transistor T23 are both electrically coupled to the N+2th horizontal scan line G(N+2) mainly for realizing three stages of a voltage level of the Nth gate signal point Q(N), and in the first stage, the voltage level is raised to a high voltage level and kept for a certain period, and in the second stage, the voltage level is raised to another high voltage level and kept for another certain period based on the first stage, and in the third stage, the voltage level is dropped to the high voltage level of the first stage to be hold based on the second stage, and then self-compensation of the threshold voltage is implemented in the third stage.

The voltage level of the Nth gate signal point Q(N) has the three stages, and a variation of the voltage level in the third stage is mainly influenced by the sixth thin film transistor T6 or the fifteenth thin film transistor T15.

The second DC low voltage VSS2 is a negative voltage source. The voltage level of the second DC low voltage VSS2 is lower than the voltage of the first DC low voltage VSS1.

The benefits of the present invention are: the present invention provides a self-compensating gate driving circuit. By utilizing the bootstrap function of the capacitor to control the first circuit point P(N) or the third circuit point K(N) of the pull-down holding part, it is possible to carry out the function of detecting the threshold voltage of the thin film transistor and to store the threshold voltage at the first circuit point P(N) or the third circuit point K(N). Accordingly, the variation of the control voltage at the first circuit point P(N) or the third circuit point K(N) along with the threshold voltage drift of the thin film transistor can be realized; by introducing the lower negative voltage source VSS2 to control the Nth transmission signal ST(N) and to employ the Nth transmission signal ST(N) to control the first circuit point P(N) or the third circuit point K(N). Accordingly, the leakage of first circuit point P(N) or the third circuit point K(N) can be reduced to ensure the voltage levels thereof can be preserved better. The present invention designs the self-compensating pull-down holding part to promote the reliability of the long term operation for the gate driving circuit and to diminish the influence of the threshold voltage drift to the operation of the gate driving circuit.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Embodiments of the present invention are described in detail with the technical matters, structural features, achieved objects, and effects with reference to the accompanying drawings as follows.

Figure 1:
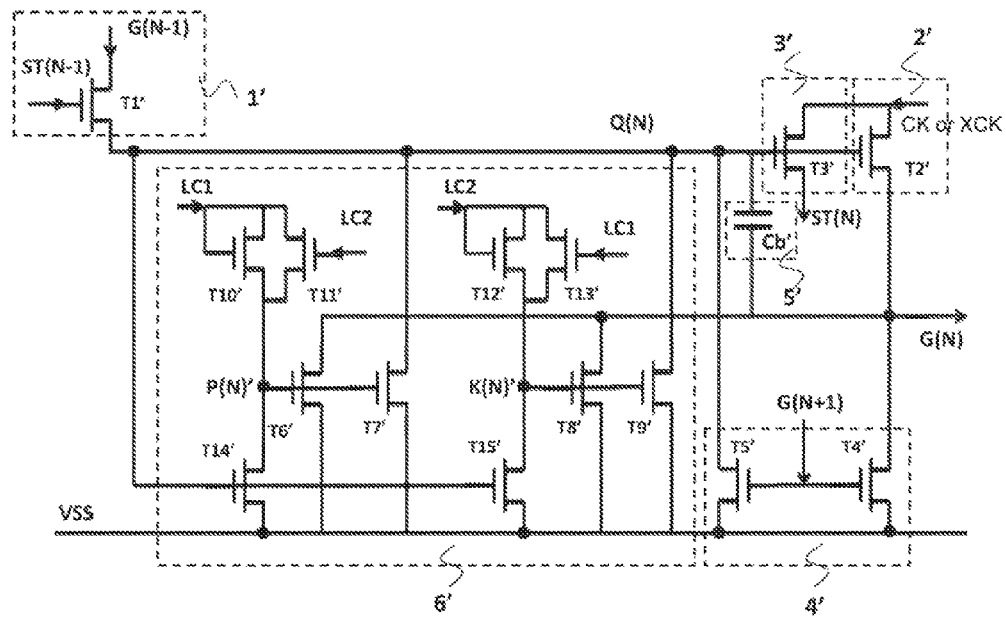
FIG. 1 is a structural diagram of a commonly employed gate driving circuit according to prior art.
Figure 2A:
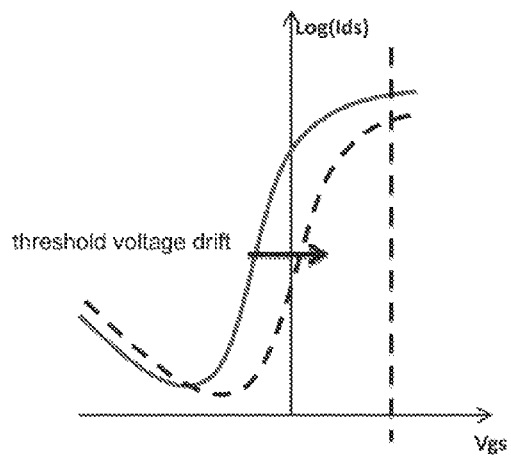
FIG. 2a is a relationship diagram of the overall current logarithm and the voltage curve of the thin film transistor before and after the threshold voltage drift.
Figure 2B:
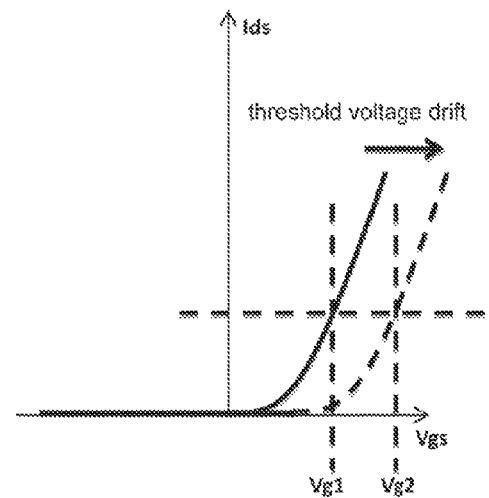
FIG. 2b is a relationship diagram of the overall current and the voltage curve of the thin film transistor before and after the threshold voltage drift.
Figure 3:
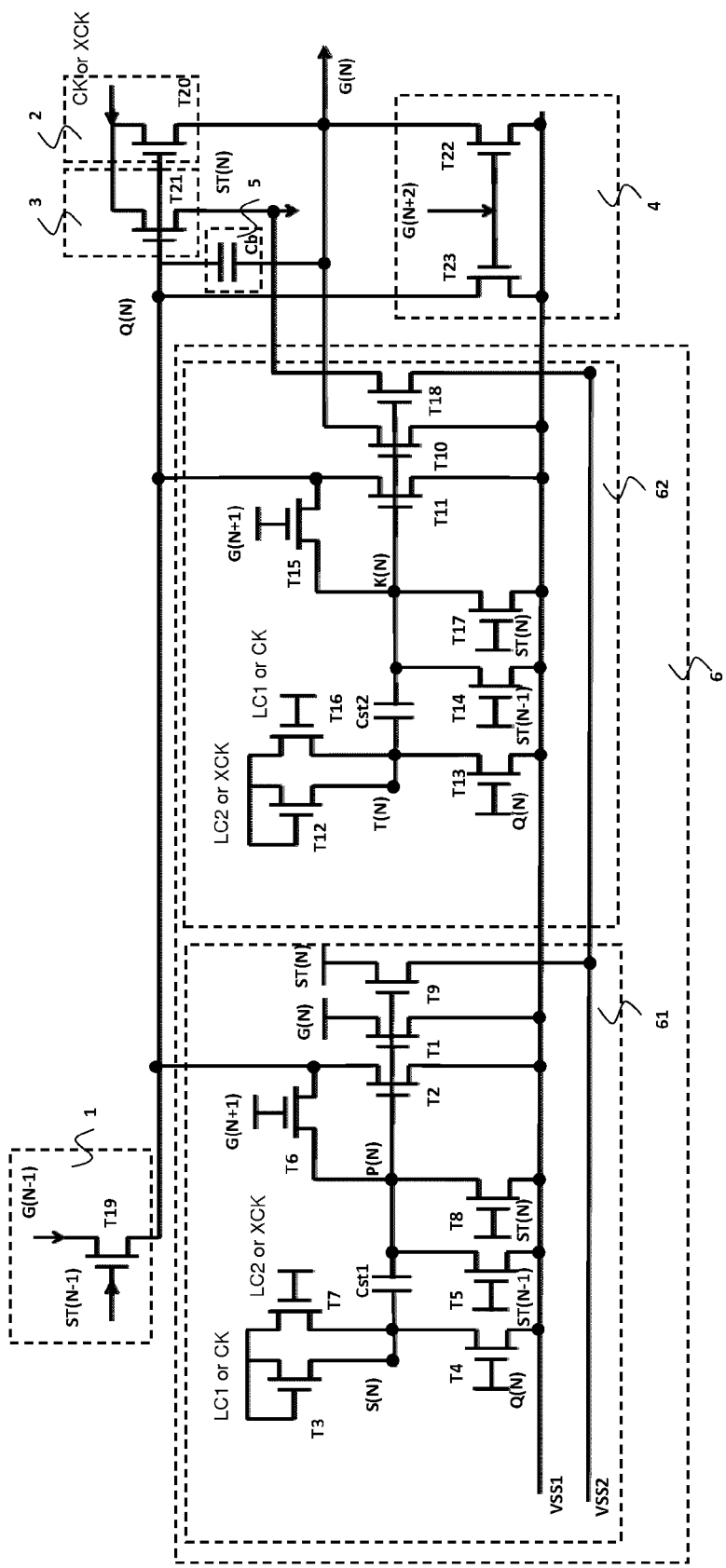
FIG. 3 is a single level structural diagram of a self-compensating gate driving circuit according to the present invention.

Please refer to FIG. 3, which is a single level structural diagram of a self-compensating gate driving circuit according to the present invention. The self-compensating gate driving circuit comprises: a plurality of GOA units which are cascade connected, and a Nth GOA unit controls charge to a Nth horizontal scanning line G(n) in a display area and the Nth GOA unit comprises a pull-up controlling part 1, a pull-up part 2, a transmission part 3, a first pull-down part 4, a bootstrap capacitor part 5 and a pull-down holding part 6; the pull-up part 2, the first pull-down part 4, the bootstrap capacitor part 5 and the pull-down holding circuit 6 are respectively coupled to a Nth gate signal point Q(N) and the Nth horizontal scanning line G(n), and the pull-up controlling part 1 and the transmission part 3 are respectively coupled to the Nth gate signal point Q(N), and the pull-down holding part 6 is inputted with a first DC low voltage VSS1 and a second DC low voltage VSS2;

the pull-down holding part 6 comprises a first pull-down holding part 61 and a second pull-down holding part 62 to alternately work;

the first pull-down holding part 61 comprises: a first thin film transistor T1, and a gate of the first thin film transistor T1 is electrically coupled to the first circuit point P(N), and a drain is electrically coupled to the Nth horizontal scanning line G(N), and a source is inputted with the first DC low voltage VSS1; a second thin film transistor T2, and a gate of the second thin film transistor T2 is electrically coupled to the first circuit point P(N), and a drain is electrically coupled to the Nth gate signal point Q(N), and a source is inputted with the first DC low voltage VSS1; a third thin film transistor T3, and a gate of the third thin film transistor T3 is electrically coupled to a first low frequency clock or a first high frequency clock, and a drain is electrically coupled to the first low frequency clock or a first high frequency clock, and a source is electrically coupled to a second circuit point S(N); a fourth thin film transistor T4, and a gate of the fourth thin film transistor T4 is electrically coupled to the Nth gate signal point Q(N), and a drain is electrically coupled to the second circuit point S(N), and a source is inputted with the first DC low voltage VSS1; a fifth thin film transistor T5, and a gate of the fifth thin film transistor T5 is electrically coupled to a N−1th transmission signal ST(N−1), a drain is electrically coupled to the first circuit point P(N), and a source is inputted with the first DC low voltage VSS1; a sixth thin film transistor T6, and a gate of the sixth thin film transistor T6 is electrically coupled to a N+1th horizontal scan line G(N+1), and a drain is electrically coupled to the first circuit point P(N), and a source is electrically coupled to the Nth gate signal point Q(N); a seventh thin film transistor T7, and a gate of the seventh thin film transistor T7 is electrically coupled to a second low frequency clock LC2 or a second high frequency clock XCK, and a drain is a first low frequency clock LC1 or a first high frequency clock CK, and a source is electrically coupled to the second circuit point S(N); an eighth thin film transistor T8, and a gate of the eighth thin film transistor T8 is electrically coupled to a Nth transmission signal ST(N), and a drain is electrically coupled to the first circuit point P(N), and a source is inputted with the first DC low voltage VSS1; a ninth thin film transistor T9, and a gate of the ninth thin film transistor T9 is electrically coupled to the first circuit point P(N), and a drain is electrically coupled to the Nth transmission signal ST(N), and a source is inputted with a second DC low voltage VSS2; a first capacitor Cst1, and an upper electrode plate of the first capacitor Cst1 is electrically coupled to the second circuit point S(N) and a lower electrode plate of the first capacitor Cst1 is electrically coupled to the first circuit point P(N);

the second pull-down holding part 62 comprises: a tenth thin film transistor T10, and a gate of the tenth thin film transistor T10 is electrically coupled to the third circuit point K(N), and a drain is electrically coupled to the Nth horizontal scanning line G(N), and a source is inputted with the first DC low voltage VSS1; an eleventh thin film transistor T11, and a gate of the eleventh thin film transistor T11 is electrically coupled to the third circuit point K(N), and a drain is electrically coupled to the Nth gate signal point Q(N), and a source is inputted with the first DC low voltage VSS1; a twelfth thin film transistor T12, and a gate of the twelfth thin film transistor T12 is electrically coupled to a second low frequency clock LC2 or a second high frequency clock XCK, and a drain is electrically coupled to a second low frequency clock LC2 or a second high frequency clock XCK, and a source is electrically coupled to a fourth circuit point T(N); a thirteenth thin film transistor T13, and a gate of the thirteenth thin film transistor T13 is electrically coupled to the Nth gate signal point Q(N), and a drain is electrically coupled to the fourth circuit point T(N), and a source is inputted with the first DC low voltage VSS1; a fourteenth thin film transistor T14, and a gate of the fourteenth thin film transistor T14 is electrically coupled to a N−1th transmission signal ST(N−1), a drain is electrically coupled to the third circuit point K(N), and a source is inputted with the first DC low voltage VSS1; a fifteenth thin film transistor T15, and a gate of the fifteenth thin film transistor T15 is electrically coupled to a N+1th horizontal scan line G(N+1), and a drain is electrically coupled to the third circuit point K(N), and a source is electrically coupled to the Nth gate signal point Q(N); a sixteenth thin film transistor T16, and a gate of the sixteenth thin film transistor T16 is electrically coupled to a first low frequency clock LC1 or a first high frequency clock CK, and a drain is a second low frequency clock LC2 or a second high frequency clock XCK, and a source is electrically coupled to the fourth circuit point T(N); a seventeenth thin film transistor T17, and a gate of the seventeenth thin film transistor T17 is electrically coupled to the Nth transmission signal ST(N), and a drain is electrically coupled to the third circuit point K(N), and a source is inputted with the first DC low voltage VSS1; an eighteenth thin film transistor T18, and a gate of the eighteenth thin film transistor T18 is electrically coupled to the third circuit point K(N), and a drain is electrically coupled to the Nth transmission signal ST(N), and a source is inputted with the second DC low voltage VSS2; a second capacitor Cst2, and an upper electrode plate of the second capacitor Cst2 is electrically coupled to the fourth circuit point T(N) and a lower electrode plate of the second capacitor Cst2 is electrically coupled to the third circuit point K(N).

The pull-up controlling part 1 comprises: a nineteenth thin film transistor T19, and a gate of the nineteenth thin film transistor T19 is inputted with a transmission signal ST(N−1) from a N−1th GOA unit, and a drain is electrically coupled to a N−1th horizontal scan line G(N−1), and a source is electrically coupled to the Nth gate signal point Q(N); the pull-up part 2 comprises a twentieth thin film transistor T20, and a gate of the twentieth thin film transistor T20 is electrically coupled to the Nth gate signal point Q(N), and a drain is inputted with a first high frequency clock CK or a second high frequency clock XCK, and a source is electrically coupled to the Nth horizontal scan line G(N); the transmission part 3 comprises a twenty-first thin film transistor T21, and a gate of the twenty-first thin film transistor T21 is electrically coupled to the Nth gate signal point Q(N), and a drain is inputted with the first high frequency clock CK or the second high frequency clock XCK, and a source outputs a Nth transmission signal ST(N); the first pull-down part 4 comprises a twenty-second thin film transistor T22, and a gate of the twenty-second thin film transistor T22 is electrically coupled to a N+2th horizontal scan line G(N+2), and a drain is electrically coupled to the Nth horizontal scan line G(N), and a source is inputted with the first DC low voltage VSS1; a twenty-third thin film transistor T23, and a gate of the twenty-third thin film transistor T23 is electrically coupled to the N+2th horizontal scan line G(N+2), and a drain is electrically coupled to the Nth gate signal point Q(N), and a source is inputted with the first DC low voltage VSS1; the gate of the twenty-second thin film transistor T22 and the gate of the twenty-third thin film transistor T23 are both electrically coupled to the N+2th horizontal scan line G(N+2) mainly for realizing three stages of a voltage level of the Nth gate signal point Q(N), and in the first stage, the voltage level is raised to a high voltage level and kept for a certain period, and in the second stage, the voltage level is raised to another high voltage level and kept for another certain period based on the first stage, and in the third stage, the voltage level is dropped to the high voltage level of the first stage to be hold based on the second stage, and then self-compensation of the threshold voltage is implemented in the third stage; the bootstrap capacitor part 5 comprises a bootstrap capacitor Cb.

The levels of the multi-level horizontal scan line are cyclic. That is, when the symbol N of the Nth horizontal scan line G(N) is the last level (Last), the N+2th horizontal scan line G(N+2) represents the 2th horizontal scan line G(2); when the symbol N of the Nth horizontal scan line G(N) is next level to the last level (Last−1), the N+2th horizontal scan line G(N+2) represents the 1th horizontal scan line G(1) and et cetera.

Figure 4:
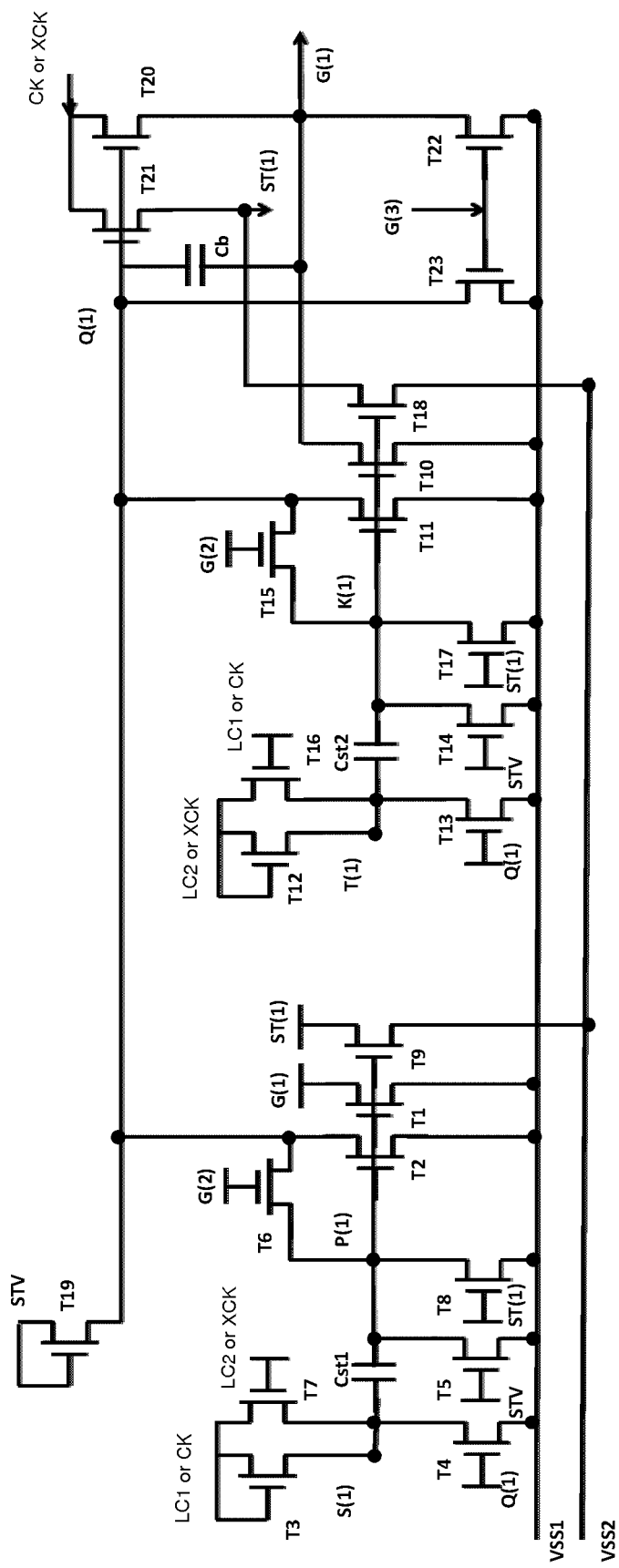
FIG. 4 is a single level structural diagram of the first level connection in the self-compensating gate driving circuit according to the present invention.

Please refer to FIG. 4 in conjunction with FIG. 3. FIG. 4 is a single level structural diagram of the first level connection in the self-compensating gate driving circuit according to the present invention, i.e. a gate driving circuit connection diagram when N is 1. The gate of the fifth thin film transistor T5 is electrically coupled to a circuit activation signal STV; the gate of the fourteenth thin film transistor T14 is electrically coupled to a circuit activation signal STV; the gate and the drain of the nineteenth thin film transistor T19 are both electrically coupled to the circuit activation signal STV.

Figure 5:
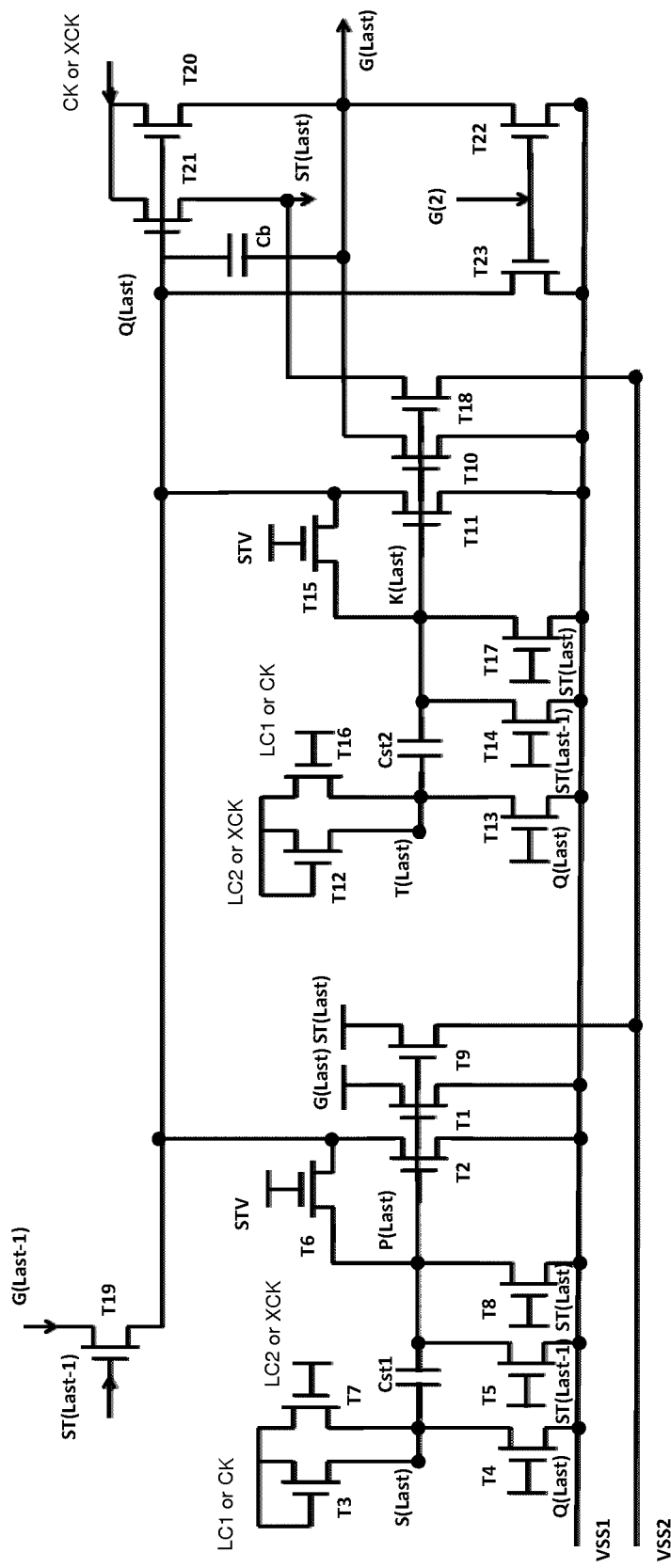
FIG. 5 is a single level structural diagram of the last level connection in the self-compensating gate driving circuit according to the present invention.

Please refer to FIG. 5 in conjunction with FIG. 3. FIG. 5 is a single level structural diagram of the last level connection in the self-compensating gate driving circuit according to the present invention, i.e. a gate driving circuit connection diagram when N is the last. The gate of the sixth thin film transistor T6 is electrically coupled to a circuit activation signal STV; the gate of the fifteenth thin film transistor T15 is electrically coupled to the circuit activation signal; the gate of the twenty-second thin film transistor T22 is electrically coupled to the 2th horizontal scan line G(2); the gate of the twenty-third thin film transistor T23 is electrically coupled to the 2th horizontal scan line G(2).

Figure 6:
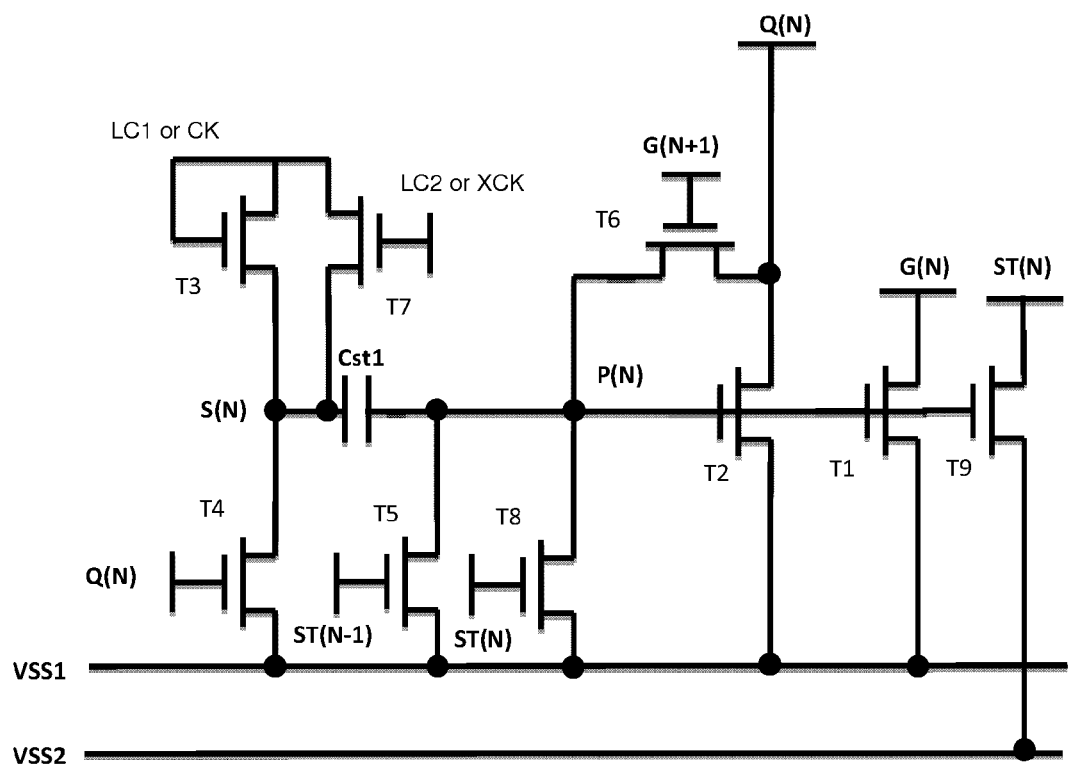
FIG. 6 is a circuit diagram of the first embodiment of the first pull-down holding part employed in FIG. 3.

Please refer to FIG. 6, which is a circuit diagram of the first embodiment of the first pull-down holding part employed in FIG. 3. The first pull-down holding part comprises: a first thin film transistor T1, and a gate of the first thin film transistor T1 is electrically coupled to the first circuit point P(N), and a drain is electrically coupled to the Nth horizontal scanning line G(N), and a source is inputted with the first DC low voltage VSS1; a second thin film transistor T2, and a gate of the second thin film transistor T2 is electrically coupled to the first circuit point P(N), and a drain is electrically coupled to the Nth gate signal point Q(N), and a source is inputted with the first DC low voltage VSS1; a third thin film transistor T3, which utilizes a diode-connection, and a gate of the third thin film transistor T3 is electrically coupled to a first low frequency clock LC1 or a first high frequency clock CK, and a drain is electrically coupled to the first low frequency clock LC1 or a first high frequency clock CK, and a source is electrically coupled to a second circuit point S(N); a fourth thin film transistor T4, and a gate of the fourth thin film transistor T4 is electrically coupled to the Nth gate signal point Q(N), and a drain is electrically coupled to the second circuit point S(N), and a source is inputted with the first DC low voltage VSS1. The fourth thin film transistor T4 is mainly to pull down the second circuit point S(N) during its functioning period to realize the objective of controlling the first circuit point P(N) by the second circuit point S(N); a fifth thin film transistor T5, and a gate of the fifth thin film transistor T5 is electrically coupled to a N−1th transmission signal ST(N−1), a drain is electrically coupled to the first circuit point P(N), and a source is inputted with the first DC low voltage VSS1; a sixth thin film transistor T6, and a gate of the sixth thin film transistor T6 is electrically coupled to a N+1th horizontal scan line G(N+1), and a drain is electrically coupled to the first circuit point P(N), and a source is electrically coupled to the Nth gate signal point Q(N). The objective of such design is to utilize the voltage level in the third stage of the three stages of the Nth gate signal point Q(N) to detect the threshold voltage and to store the voltage level of the threshold voltage at the first circuit point P(N); a seventh thin film transistor T7, and a gate of the seventh thin film transistor is electrically coupled to a second low frequency clock LC2 or a second high frequency clock XCK, and a drain is a first low frequency clock LC1 or a first high frequency clock CK, and a source is electrically coupled to the second circuit point S(N); an eighth thin film transistor T8, and a gate of the eighth thin film transistor T8 is electrically coupled to a Nth transmission signal ST(N), and a drain is electrically coupled to the first circuit point P(N), and a source is inputted with the first DC low voltage VSS1; a ninth thin film transistor T9, and a gate of the ninth thin film transistor T9 is electrically coupled to the first circuit point P(N), and a drain is electrically coupled to the Nth transmission signal ST(N), and a source is inputted with a second DC low voltage VSS2. The ninth thin film transistor T9 is in charge of pulling down the Nth transmission signal ST(N) to the low voltage level, the second DC low voltage VSS2; a first capacitor Cst1, and an upper electrode plate of the first capacitor Cst1 is electrically coupled to the second circuit point S(N) and a lower electrode plate of the first capacitor Cst1 is electrically coupled to the first circuit point P(N).

The second DC low voltage VSS2 is a negative voltage source. The voltage level of the second DC low voltage VSS2 is lower than the voltage of the first DC low voltage VSS1. The second DC low voltage VSS2 is mainly in charge of processing the Nth transmission signal ST(N) to ensure that the Nth transmission signal ST(N) can be well and steadily preserved at a lower voltage level in the non functioning period. Therefore, the gate-source voltages Vgs of the fifth thin film transistor T5 and the eighth thin film transistor T8 controlled by the Nth transmission signal ST(N) can be guaranteed to be smaller than zero and the leakage can be effectively reduced.

Figures 7A, 7B:
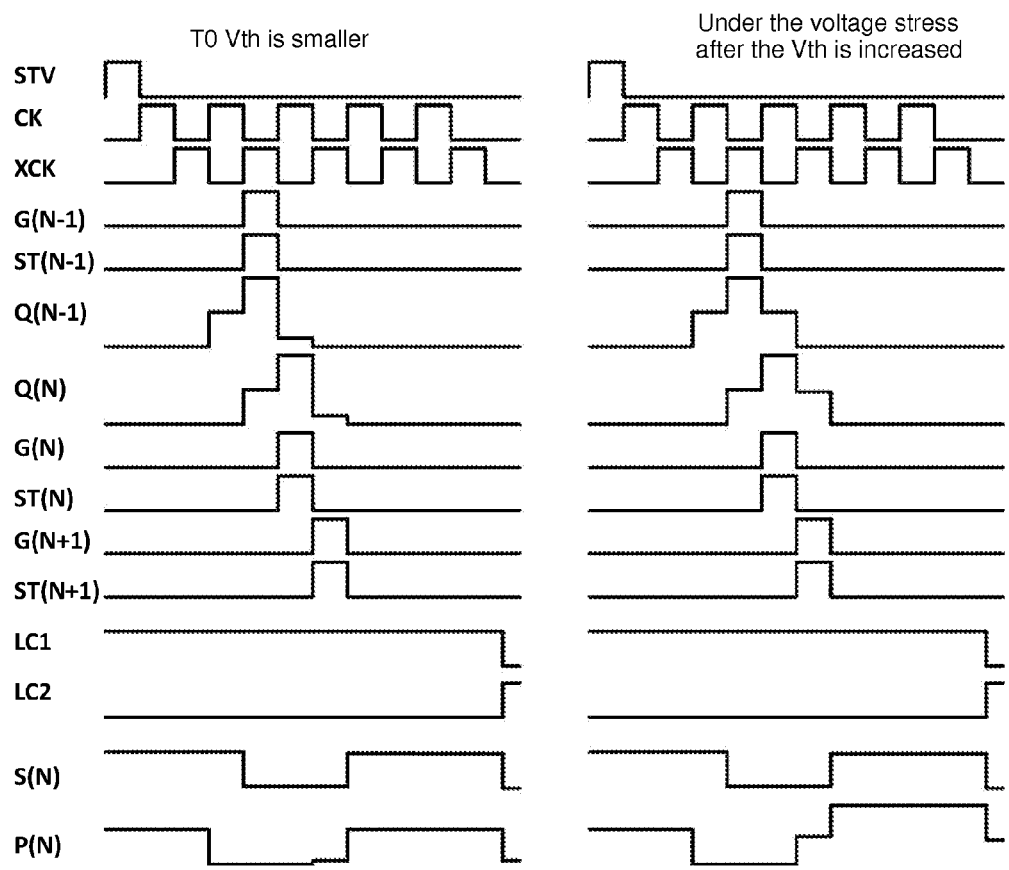
FIG. 7a is a sequence diagram of gate driving circuit shown in FIG. 3 before the threshold voltage drift.
FIG. 7b is a sequence diagram of gate driving circuit shown in FIG. 3 after the threshold voltage drift.

Please refer to FIGS. 7a, 7b in conjunction with FIG. 3. FIG. 7a is a sequence diagram of gate driving circuit shown in FIG. 3 before the threshold voltage drift. FIG. 7b is a sequence diagram of gate driving circuit shown in FIG. 3 after the threshold voltage drift. In FIGS. 7a, 7b, the STV signal is a circuit activation signal. The first high frequency clock CK and the second high frequency clock XCK are two high frequency clocks that phases are completely opposite and the first low frequency clock LC1 and the second low frequency clock LC2 are two low frequency clocks that phases are completely opposite. G(N−1) is an N−1th horizontal scan line, i.e. the former level scan output signal. ST(N−1) is an N−1th transmission signal, i.e. the former level transmission signal. Q(N−1) is an N−1th gate signal point, i.e. the former level gate signal point. Q(N) is an Nth gate signal point, i.e. the present level gate signal point.

FIGS. 7a, 7b are sequence diagrams that the first low frequency clock LC1 in the working state, i.e. the sequence diagrams of the pull-down holding part 61 in the working state. As shown in figures, the voltage level of the Nth gate signal point Q(N) has the three stages, and in the first stage, the voltage level is raised to a high voltage level and kept for a certain period, and in the second stage, the voltage level is raised to another high voltage level and kept for another certain period based on the first stage, and in the third stage, the voltage level is dropped to the high voltage level of the first stage to be hold based on the second stage, and the variation of the voltage level in the third stage is mainly influenced by the sixth thin film transistor T6. As shown in FIG. 7a, at the initial time T0 when the liquid crystal panel is just lighted, the threshold voltage Vth is smaller. That is, the drift of the threshold voltage Vth has not occurred because the gate driving circuit did not go through a long term operation. The voltage level at the Nth gate signal point Q(N) in the third stage is lower and the voltage level at the corresponding first circuit point P(N) is lower, too. As shown in FIG. 7b, the threshold voltage Vth at the gate signal point Q(N) in the third stage is drifted and raised under the stress of the voltage. The objective of detecting the threshold voltages of the first thin film transistor T1 and the second thin film transistor T2 can be achieved thereby.

As shown in FIG. 7a and FIG. 7b, the working procedure of the gate driving circuit shown in FIG. 3 is: the sixth thin film transistor T6 is activated when the N+1th horizontal scan line G(N+1) is conducted. Now, the voltage levels of the Nth gate signal point Q(N) and the first circuit point P(N)

are the same. The second thin film transistor T2 becomes equivalent to a diode-connection. The threshold voltage values of the first thin film transistor T1 and the second thin film transistor T2 can be stored at the first circuit point P(N) by the sixth thin film transistor T6 in the third stage of the Nth gate signal point Q(N). Thus, along with the drifts of the threshold voltages Vth, the voltage level of the Nth gate signal point Q(N) in the third stage is raised, and the voltage level of the threshold voltage stored at the first circuit point P(N) is raised, too. Then, the second circuit point S(N) raises the first circuit point P(N) by the first capacitor Cst1 to compensate the variation of the threshold voltage.

As shown in FIGS. 7a, 7b, before and after the threshold voltage drift, the voltage levels of the Nth gate signal point Q(N) and the first circuit point P(N) obviously change. Particularly, the voltage level increase of the first circuit point P(N) can effectively decrease the influence of the threshold voltage drift to the activation currents of the first thin film transistor T1 and the second thin film transistor T2. Accordingly, the Nth horizontal scan line G(N) and the Nth gate signal point Q(N) can still keep in a low voltage level state even after a long term operation.

Similarly, as referring to the second low frequency clock LC2 in the working state (not shown), the second pull-down holding part 62 is functioning. the voltage level of the Nth gate signal point Q(N) has the three stages, and in the first stage, the voltage level is raised to a high voltage level and kept for a certain period, and in the second stage, the voltage level is raised to another high voltage level and kept for another certain period based on the first stage, and in the third stage, the voltage level is dropped to the high voltage level of the first stage to be hold based on the second stage, and the variation of the voltage level in the third stage is mainly influenced by the fifteenth thin film transistor T15. In the third stage, the voltage level in the third stage is lower before the drift of the threshold voltage occurs and is raised after the drift of the threshold voltage occurs. The objective of detecting the threshold voltages of the tenth thin film transistor T10 and the eleventh thin film transistor T11 can be achieved thereby. Here, the working procedure of the gate driving circuit shown in FIG. 3 is: the fifteenth thin film transistor T15 is activated when the N+1th horizontal scan line G(N+1) is conducted. Now, the voltage levels of the Nth gate signal point Q(N) and the third circuit point K(N) are the same. The eleventh thin film transistor T11 becomes equivalent to a diode-connection. The threshold voltage values of the tenth thin film transistor T10 and the eleventh thin film transistor T11 can be stored at the third circuit point K(N) by the fifteenth thin film transistor T15 in the third stage of the Nth gate signal point Q(N). Thus, along with the drifts of the threshold voltages Vth, the voltage level of the Nth gate signal point Q(N) in the third stage is raised, and the voltage level of the threshold voltage stored at the third circuit point K(N) is raised, too. Then, the fourth circuit point T(N) raises the third circuit point K(N) by the second capacitor Cst2 to compensate the variation of the threshold voltage. Accordingly, the Nth horizontal scan line G(N) and the Nth gate signal point Q(N) can still well preserved in a low voltage level state even after a long term operation.

As shown in FIGS. 7a, 7b, the first low frequency clock LC1 and the second low frequency clock LC2 alternately work. That is, the first pull-down holding part 61 and the second pull-down holding part 62 alternately work. The working time of each part can be reduced thereby. The suffered voltage stress is decreased to promote the reliability of the entire circuit.

Figure 8:
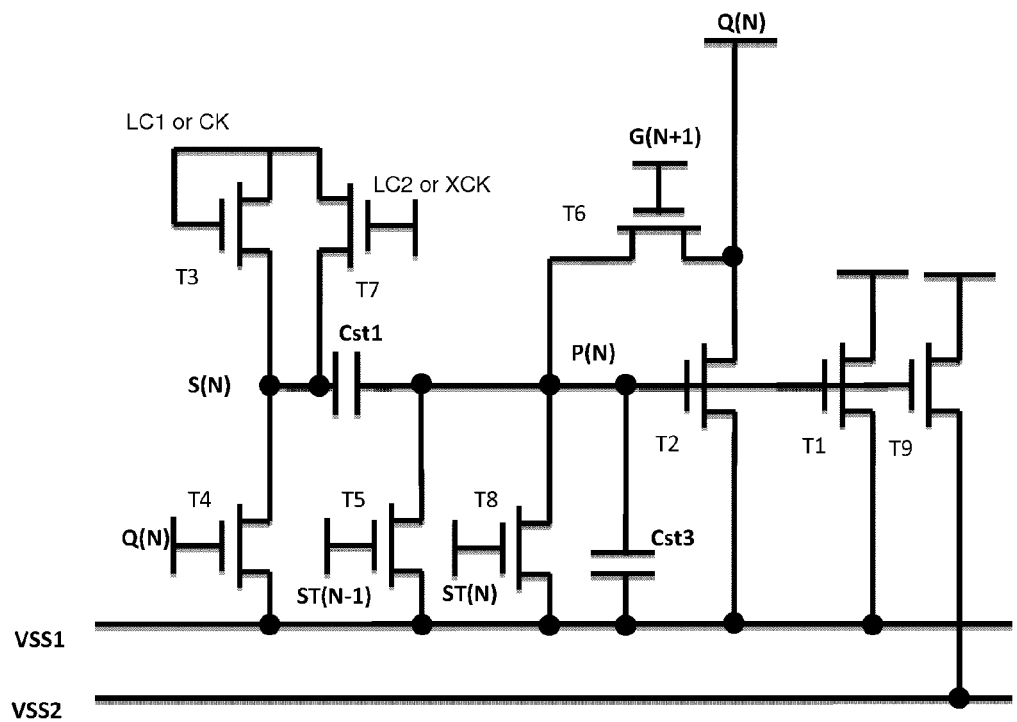
FIG. 8 is a circuit diagram of the second embodiment of the first pull-down holding part employed in FIG. 3.

Please refer to FIG. 8 in conjunction with FIG. 6. FIG. 8 is a circuit diagram of the second embodiment of the first pull-down holding part employed in FIG. 3. In FIG. 8, a third capacitor Cst3 is added on the basis of FIG. 6. An upper electrode plate of the third capacitor Cst3 is electrically coupled to the first circuit point P(N) and a lower electrode plate of the third capacitor Cst3 is inputted with the first DC low voltage VSS1. The main function of the third capacitor Cst3 is to store the threshold voltage. The circuit structures of the first pull-down holding part and the second pull-down holding part are the same. Certain parasitic capacitance exist in the first thin film transistor T1 and the second thin film transistor T2 themselves and the function of the third capacitor Cst3 can be replaced thereby. Therefore, in actual circuit design, the third capacitor Cst3 can be omitted.

Figure 9:
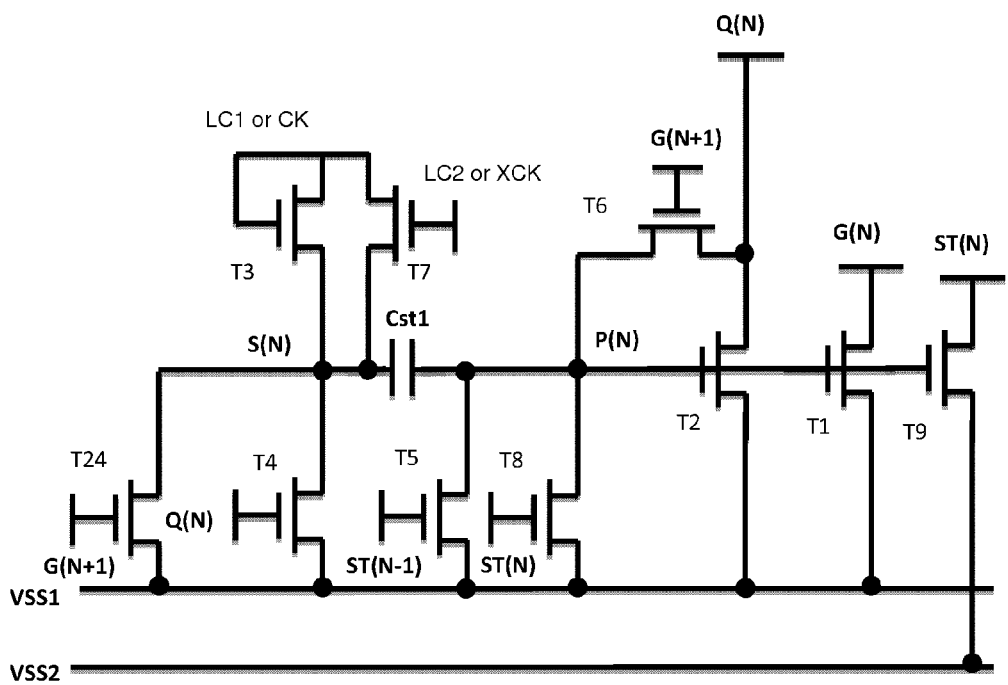
FIG. 9 is a circuit diagram of the third embodiment of the first pull-down holding part employed in FIG. 3.

Please refer to FIG. 9 in conjunction with FIG. 6. FIG. 9 is a circuit diagram of the third embodiment of the first pull-down holding part employed in FIG. 3. In FIG. 9, a twenty-fourth thin film transistor T24 is added on the basis of FIG. 6. A gate of the twenty-fourth thin film transistor T24 is electrically coupled to the N+1th horizontal scan line G(N+1), and a drain is electrically coupled to the second circuit point S(N), and a source is inputted with the first DC low voltage VSS1; the circuit structures of the first pull-down holding part and the second pull-down holding part are the same. The main objective of the twenty-fourth thin film transistor T24 is to compensate that voltage level of the Nth gate signal point Q(N) in the first stage is not high enough and leads to a insufficient pulling down of the voltage level to the second circuit point S(N) in the functioning period.

Figure 10:
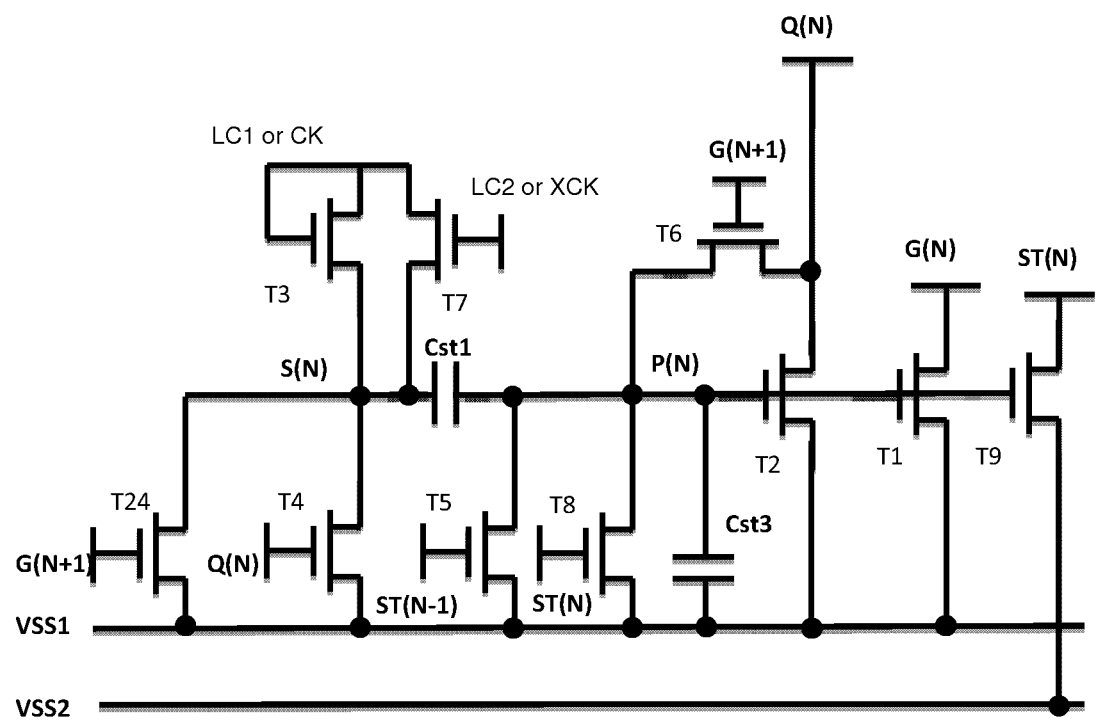
FIG. 10 is a circuit diagram of the fourth embodiment of the first pull-down holding part employed in FIG. 3.

Please refer to FIG. 10 in conjunction with FIG. 6. FIG. 10 is a circuit diagram of the fourth embodiment of the first pull-down holding part employed in FIG. 3. What is added in FIG. 10 on the basis of FIG. 6 is: a third capacitor Cst3, and an upper electrode plate of the third capacitor Cst3 is electrically coupled to the first circuit point P(N) and a lower electrode plate of the third capacitor Cst3 is inputted with the first DC low voltage VSS1; a twenty-fourth thin film transistor T24, and a gate of the twenty-fourth thin film transistor T24 is electrically coupled to the N+1th horizontal scan line G(N+1), and a drain is electrically coupled to the second circuit point S(N), and a source is inputted with the first DC low voltage VSS1. The circuit structures of the first pull-down holding part and the second pull-down holding part are the same.

The first pull-down holding part 61 and the second pull-down holding part 62 of the structure gate driving circuit shown in FIG. 3 can be replaced with any one design of FIG. 6, FIG. 8, FIG. 9 and FIG. 10. The circuit structures of the first pull-down holding part and the second pull-down holding part are the same. The sequence diagrams of the replaced gate driving circuit are the same as shown in FIG. 7a and FIG. 7b. The working procedures are the same as described related with the gate driving circuit shown in FIG. 3. The repeated description is omitted here.

In conclusion, the present invention provides a self-compensating gate driving circuit. As considering the most possible failure issue of the pull-down holding part suffered with serious voltage stress under structure of the gate driving circuit according to prior art, by utilizing the bootstrap function of the capacitor to control the first circuit point P(N) or the third circuit point K(N) of the pull-down holding part, it is possible to carry out the function of detecting the threshold voltage of the thin film transistor and to store the threshold voltage at the first circuit point P(N) or the third circuit point K(N). Accordingly, the variation of the control voltage at the first circuit point P(N) or the third circuit point K(N) along with the threshold voltage drift of the thin film transistor can be realized; by introducing the lower negative voltage source VSS2 to control the Nth transmission signal ST(N) and to employ the Nth transmission signal ST(N) to control the first circuit point P(N) or the third circuit point K(N). Accordingly, the leakage of first circuit point P(N) or the third circuit point K(N) can be reduced to ensure the voltage levels thereof can be preserved better. The present invention designs the self-compensating pull-down holding part to promote the reliability of the long term operation for the gate driving circuit and to diminish the influence of the threshold voltage drift to the operation of the gate driving circuit.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A self-compensating gate driving circuit, comprising: a plurality of gate driver on array units which are cascade connected, and a Nth gate driver on array unit controls charge to a Nth horizontal scanning line in a display area, and the Nth gate driver on array unit comprises a pull-up controlling part, a pull-up part, a transmission part, a first pull-down part, a bootstrap capacitor part and a pull-down holding part; the pull-up part, the first pull-down part, the bootstrap capacitor part and the pull-down holding circuit are respectively coupled to a Nth gate signal point and the Nth horizontal scanning line, and the pull-up controlling part and the transmission part are respectively coupled to the Nth gate signal point, and the pull-down holding part is inputted with a first DC low voltage and a second DC low voltage;

the pull-down holding part comprises a first pull-down holding part and a second pull-down holding part to alternately work;

the first pull-down holding part comprises: a first thin film transistor, and a gate of the first thin film transistor is electrically coupled to a first circuit point, and a drain is electrically coupled to the Nth horizontal scanning line, and a source is inputted with the first DC low voltage; a second thin film transistor, and a gate of the second thin film transistor is electrically coupled to the first circuit point, and a drain is electrically coupled to the Nth gate signal point, and a source is inputted with the first DC low voltage; a third thin film transistor, and a gate of the third thin film transistor is electrically coupled to a first low frequency clock or a first high frequency clock, and a drain is electrically coupled to a first low frequency clock or a first high frequency clock, and a source is electrically coupled to a second circuit point; a fourth thin film transistor, and a gate of the fourth thin film transistor is electrically coupled to the Nth gate signal point, and a drain is electrically coupled to the second circuit point, and a source is inputted with the first DC low voltage; a fifth thin film transistor, and a gate of the fifth thin film transistor is electrically coupled to a N−1th transmission signal, a drain is electrically coupled to the first circuit point, and a source is inputted with the first DC low voltage; a sixth thin film transistor, and a gate of the sixth thin film transistor is electrically coupled to a N+1th horizontal scan line, and a drain is electrically coupled to the first circuit point, and a source is electrically coupled to the Nth gate signal point; a seventh thin film transistor, and a gate of the seventh thin film transistor is electrically coupled to a second low frequency clock or a second high frequency clock, and a drain is a first low frequency clock or a first high frequency clock, and a source is electrically coupled to the second circuit point; an eighth thin film transistor, and a gate of the eighth thin film transistor is electrically coupled to a Nth transmission signal, and a drain is electrically coupled to the first circuit point, and a source is inputted with the first DC low voltage; a ninth thin film transistor, and a gate of the ninth thin film transistor is electrically coupled to the first circuit point, and a drain is electrically coupled to the Nth transmission signal, and a source is inputted with a second DC low voltage; a first capacitor, and an upper electrode plate of the first capacitor is electrically coupled to the second circuit point and a lower electrode plate of the first capacitor is electrically coupled to the first circuit point;

the second pull-down holding part comprises: a tenth thin film transistor, and a gate of the tenth thin film transistor is electrically coupled to a third circuit point, and a drain is electrically coupled to the Nth horizontal scanning line, and a source is inputted with the first DC low voltage; an eleventh thin film transistor, and a gate of the eleventh thin film transistor is electrically coupled to the third circuit point, and a drain is electrically coupled to the Nth gate signal point, and a source is inputted with the first DC low voltage; a twelfth thin film transistor, and a gate of the twelfth thin film transistor is electrically coupled to a second low frequency clock or a second high frequency clock, and a drain is electrically coupled to a second low frequency clock or a second high frequency clock, and a source is electrically coupled to a fourth circuit point; a thirteenth thin film transistor, and a gate of the thirteenth thin film transistor is electrically coupled to the Nth gate signal point, and a drain is electrically coupled to the fourth circuit point, and a source is inputted with the first DC low voltage; a fourteenth thin film transistor, and a gate of the fourteenth thin film transistor is electrically coupled to a N−1th transmission signal, a drain is electrically coupled to the third circuit point, and a source is inputted with the first DC low voltage; a fifteenth thin film transistor, and a gate of the fifteenth thin film transistor is electrically coupled to a N+1th horizontal scan line, and a drain is electrically coupled to the third circuit point, and a source is electrically coupled to the Nth gate signal point; a sixteenth thin film transistor, and a gate of the sixteenth thin film transistor is electrically coupled to a first low frequency clock or a first high frequency clock, and a drain is a second low frequency clock or a second high frequency clock, and a source is electrically coupled to the fourth circuit point; a seventeenth thin film transistor, and a gate of the seventeenth thin film transistor is electrically coupled to the Nth transmission signal, and a drain is electrically coupled to the third circuit point, and a source is inputted with the first DC low voltage; an eighteenth thin film transistor, and a gate of the eighteenth thin film transistor is electrically coupled to the third circuit point, and a drain is electrically coupled to the Nth transmission signal, and a source is inputted with the second DC low voltage; a second capacitor, and an upper electrode plate of the second capacitor is electrically coupled to the fourth circuit point and a lower electrode plate of the second capacitor is electrically coupled to the third circuit point.

2. The self-compensating gate driving circuit according to claim 1, wherein the pull-up controlling part comprises: a nineteenth thin film transistor, and a gate of the nineteenth thin film transistor is inputted with a transmission signal from a N−1th gate driver on array unit, and a drain is electrically coupled to a N−1th horizontal scan line, and a source is electrically coupled to the Nth gate signal point; the pull-up part comprises a twentieth thin film transistor, and a gate of the twentieth thin film transistor is electrically coupled to the Nth gate signal point, and a drain is inputted with a first high frequency clock or a second high frequency clock, and a source is electrically coupled to the Nth horizontal scan line; the transmission part comprises a twenty-first thin film transistor, and a gate of the twenty-first thin film transistor is electrically coupled to the Nth gate signal point, and a drain is inputted with the first high frequency clock or the second high frequency clock, and a source outputs a Nth transmission signal; the first pull-down part comprises a twenty-second thin film transistor, and a gate of the twenty-second thin film transistor is electrically coupled to a N+2th horizontal scan line, and a drain is electrically coupled to the Nth horizontal scan line, and a source is inputted with the first DC low voltage; a twenty-third thin film transistor, and a gate of the twenty-third thin film transistor is electrically coupled to the N+2th horizontal scan line, and a drain is electrically coupled to the Nth gate signal point, and a source is inputted with the first DC low voltage; the bootstrap capacitor part comprises a bootstrap capacitor.

3. The self-compensating gate driving circuit according to claim 2, wherein in first level connection, the gate of the fifth thin film transistor is electrically coupled to a circuit activation signal; the gate of the fourteenth thin film transistor is electrically coupled to the circuit activation signal; the gate and the drain of the nineteenth thin film transistor are both electrically coupled to the circuit activation signal.

4. The self-compensating gate driving circuit according to claim 2, wherein in last level connection, the gate of the sixth thin film transistor is electrically coupled to a circuit activation signal; the gate of the fifteenth thin film transistor is electrically coupled to the circuit activation signal; the gate of the twenty-second thin film transistor is electrically coupled to the 2nd horizontal scan line; the gate of the twenty-third thin film transistor is electrically coupled to the 2nd horizontal scan line.

5. The self-compensating gate driving circuit according to claim 2, wherein the first high frequency clock and the second high frequency clock are two high frequency clocks that phases are completely opposite, and the first low frequency clock and the second low frequency clock are two low frequency clocks that phases are completely opposite.

6. The self-compensating gate driving circuit according to claim 2, wherein in the first pull-down part, the gate of the twenty-second thin film transistor and the gate of the twenty-third thin film transistor are both electrically coupled to the N+2th horizontal scan line mainly for realizing three stages of a voltage level of the Nth gate signal point, and in the first stage, the voltage level is raised to a high voltage level and kept for a certain period, and in the second stage, the voltage level is raised to another high voltage level and kept for another certain period based on the first stage, and in the third stage, the voltage level is dropped to the high voltage level of the first stage to be hold based on the second stage, and then self-compensation of the threshold voltage is implemented in the third stage.

7. The self-compensating gate driving circuit according to claim 6, wherein the voltage level of the Nth gate signal point has the three stages, and a variation of the voltage level in the third stage is mainly influenced by the sixth thin film transistor or the fifteenth thin film transistor.

8. The self-compensating gate driving circuit according to claim 1, wherein the pull-down holding part further comprises a third capacitor, and an upper electrode plate of the third capacitor is electrically coupled to the first circuit point, and a lower electrode plate of the third capacitor is inputted with the first DC low voltage.

9. The self-compensating gate driving circuit according to claim 1, wherein the first pull-down holding part further comprises a twenty-fourteenth thin film transistor, and a gate of the fourteenth thin film transistor is electrically coupled to the N+1th horizontal scan line, and a drain is electrically coupled to the second circuit point, and a source is inputted with the first DC low voltage.

10. The self-compensating gate driving circuit according to claim 1, wherein the pull-down holding part further comprises a third capacitor, and an upper electrode plate of the third capacitor is electrically coupled to the first circuit point, and a lower electrode plate of the third capacitor is electrically coupled to the first DC low voltage; a twenty-fourth thin film transistor, and a gate of the twenty-fourth thin film transistor is electrically coupled to the N+1th horizontal scan line, and a drain is electrically coupled to the second circuit point, and a source is inputted with the first DC low voltage.

11. The self-compensating gate driving circuit according to claim 1, wherein the second DC low voltage is a negative voltage source, and the voltage level of the second DC low voltage is lower than the voltage of the first DC low voltage.

12. A self-compensating gate driving circuit, comprising: a plurality of gate driver on array units which are cascade connected, and a Nth gate driver on array unit controls charge to a Nth horizontal scanning line in a display area, and the Nth gate driver on array unit comprises a pull-up controlling part, a pull-up part, a transmission part, a first pull-down part, a bootstrap capacitor part and a pull-down holding part; the pull-up part, the first pull-down part, the bootstrap capacitor part and the pull-down holding circuit are respectively coupled to a Nth gate signal point and the Nth horizontal scanning line, and the pull-up controlling part and the transmission part are respectively coupled to the Nth gate signal point, and the pull-down holding part is inputted with a first DC low voltage and a second DC low voltage;

the pull-down holding part comprises a first pull-down holding part and a second pull-down holding part to alternately work;

the first pull-down holding part comprises: a first thin film transistor, and a gate of the first thin film transistor is electrically coupled to a first circuit point, and a drain is electrically coupled to the Nth horizontal scanning line, and a source is inputted with the first DC low voltage; a second thin film transistor, and a gate of the second thin film transistor is electrically coupled to the first circuit point, and a drain is electrically coupled to the Nth gate signal point, and a source is inputted with the first DC low voltage; a third thin film transistor, and a gate is electrically coupled to a first low frequency clock or a first high frequency clock, and a drain is electrically coupled to a first low frequency clock or a first high frequency clock, and a source is electrically coupled to a second circuit point; a fourth thin film transistor, and a gate of the fourth thin film transistor is electrically coupled to the Nth gate signal point, and a drain is electrically coupled to the second circuit point, and a source is inputted with the first DC low voltage; a fifth thin film transistor, and a gate of the fifth thin film transistor is electrically coupled to a N−1th transmission signal, a drain is electrically coupled to the first circuit point, and a source is inputted with the first DC low voltage; a sixth thin film transistor, and a gate of the sixth thin film transistor is electrically coupled to a N+1th horizontal scan line, and a drain is electrically coupled to the first circuit point, and a source is electrically coupled to the Nth gate signal point; a seventh thin film transistor, and a gate of the seventh thin film transistor is electrically coupled to a second low frequency clock or a second high frequency clock, and a drain is a first low frequency clock or a first high frequency clock, and a source is electrically coupled to the second circuit point; an eighth thin film transistor, and a gate of the eighth thin film transistor is electrically coupled to a Nth transmission signal, and a drain is electrically coupled to the first circuit point, and a source is inputted with the first DC low voltage; a ninth thin film transistor, and a gate of the ninth thin film transistor is electrically coupled to the first circuit point, and a drain is electrically coupled to the Nth transmission signal, and a source is inputted with a second DC low voltage; a first capacitor, and an upper electrode plate of the first capacitor is electrically coupled to the second circuit point and a lower electrode plate of the first capacitor is electrically coupled to the first circuit point;

the second pull-down holding part comprises: a tenth thin film transistor, and a gate of the tenth thin film transistor is electrically coupled to a third circuit point, and a drain is electrically coupled to the Nth horizontal scanning line, and a source is inputted with the first DC low voltage; an eleventh thin film transistor, and a gate of the eleventh thin film transistor is electrically coupled to the third circuit point, and a drain is electrically coupled to the Nth gate signal point, and a source is inputted with the first DC low voltage; a twelfth thin film transistor, and a gate of the twelfth thin film transistor is electrically coupled to a second low frequency clock or a second high frequency clock, and a drain is electrically coupled to a second low frequency clock or a second high frequency clock, and a source is electrically coupled to a fourth circuit point; a thirteenth thin film transistor, and a gate of the thirteenth thin film transistor is electrically coupled to the Nth gate signal point, and a drain is electrically coupled to the fourth circuit point, and a source is inputted with the first DC low voltage; a fourteenth thin film transistor, and a gate of the fourteenth thin film transistor is electrically coupled to a N−1th transmission signal, a drain is electrically coupled to the third circuit point, and a source is inputted with the first DC low voltage; a fifteenth thin film transistor, and a gate of the fifteenth thin film transistor is electrically coupled to a N+1th horizontal scan line, and a drain is electrically coupled to the third circuit point, and a source is electrically coupled to the Nth gate signal point; a sixteenth thin film transistor, and a gate of the sixteenth thin film transistor is electrically coupled to a first low frequency clock or a first high frequency clock, and a drain is a second low frequency clock or a second high frequency clock, and a source is electrically coupled to the fourth circuit point; a seventeenth thin film transistor, and a gate of the seventeenth thin film transistor is electrically coupled to the Nth transmission signal, and a drain is electrically coupled to the third circuit point, and a source is inputted with the first DC low voltage; an eighteenth thin film transistor, and a gate of the eighteenth thin film transistor is electrically coupled to the third circuit point, and a drain is electrically coupled to the Nth transmission signal, and a source is inputted with the second DC low voltage; a second capacitor, and an upper electrode plate of the second capacitor is electrically coupled to the fourth circuit point and a lower electrode plate of the second capacitor is electrically coupled to the third circuit point;

wherein the pull-up controlling part comprises: a nineteenth thin film transistor, and a gate of the nineteenth thin film transistor is inputted with a transmission signal from a N−1th gate driver on array unit, and a drain is electrically coupled to a N−1th horizontal scan line, and a source is electrically coupled to the Nth gate signal point; the pull-up part comprises a twentieth thin film transistor, and a gate of the twentieth thin film transistor is electrically coupled to the Nth gate signal point, and a drain is inputted with a first high frequency clock or a second high frequency clock, and a source is electrically coupled to the Nth horizontal scan line; the transmission part comprises a twenty-first thin film transistor, and a gate of the twenty-first thin film transistor is electrically coupled to the Nth gate signal point, and a drain is inputted with the first high frequency clock or the second high frequency clock, and a source outputs a Nth transmission signal; the first pull-down part comprises a twenty-second thin film transistor, and a gate of the twenty-second thin film transistor is electrically coupled to a N+2th horizontal scan line, and a drain is electrically coupled to the Nth horizontal scan line, and a source is inputted with the first DC low voltage; a twenty-third thin film transistor, and a gate of the twenty-third thin film transistor is electrically coupled to the N+2th horizontal scan line, and a drain is electrically coupled to the Nth gate signal point, and a source is inputted with the first DC low voltage; the bootstrap capacitor part comprises a bootstrap capacitor;

wherein in first level connection, the gate of the fifth thin film transistor is electrically coupled to a circuit activation signal; the gate of the fourteenth thin film transistor is electrically coupled to the circuit activation signal; the gate and the drain of the nineteenth thin film transistor are both electrically coupled to the circuit activation signal;

wherein in last level connection, the gate of the sixth thin film transistor is electrically coupled to a circuit activation signal; the gate of the fifteenth thin film transistor is electrically coupled to the circuit activation signal; the gate of the twenty-second thin film transistor is electrically coupled to the 2nd horizontal scan line; the gate of the twenty-third thin film transistor is electrically coupled to the 2nd horizontal scan line;

wherein the first high frequency clock and the second high frequency clock are two high frequency clocks that phases are completely opposite; the first low frequency clock and the second low frequency clock are two low frequency clocks that phases are completely opposite;

wherein in the first pull-down part, the gate of the twenty-second thin film transistor and the gate of the twenty-third thin film transistor are both electrically coupled to the N+2th horizontal scan line mainly for realizing three stages of a voltage level of the Nth gate signal point, and in the first stage, the voltage level is raised to a high voltage level and kept for a certain period, and in the second stage, the voltage level is raised to another high voltage level and kept for another certain period based on the first stage, and in the third stage, the voltage level is dropped to the high voltage level of the first stage to be hold based on the second stage, and then self-compensation of the threshold voltage is implemented in the third stage;

wherein the voltage level of the Nth gate signal point has the three stages, and a variation of the voltage level in the third stage is mainly influenced by the sixth thin film transistor or the fifteenth thin film transistor; and wherein the second DC low voltage is a negative voltage source, and the voltage level of the second DC low voltage is lower than the voltage of the first DC low voltage.

* * * * *